United States Patent [19]

Hill

[11] Patent Number: 5,255,221

[45] Date of Patent: Oct. 19, 1993

[54] FULLY CONFIGURABLE VERSATILE FIELD PROGRAMMABLE FUNCTION ELEMENT

[75] Inventor: Dwight D. Hill, Holmdel, N.J.

[73] Assignee: AT&T Bell Laboratories, Murray Hill, N.J.

[21] Appl. No.: 679,370

[22] Filed: Apr. 2, 1991

[51] Int. Cl.$^5$ ............................................. G11C 7/00
[52] U.S. Cl. ........................... 365/189.08; 365/189.03
[58] Field of Search ................... 365/189.03, 189.05, 365/189.08, 189.11; 307/445, 465

[56] References Cited

U.S. PATENT DOCUMENTS 4,706,216 11/1987 Carter ................................... 365/94
4,896,296 1/1990 Turner et al. ................... 365/189.08

Primary Examiner—Steven Mottola
Attorney, Agent, or Firm—Henry T. Brendzel

[57] ABSTRACT

A field configurable function element offers multi-function use of memory cells by organizing the cells in memory banks and by providing internal configurable interconnections of the memory banks. A versatile logic function configuration is obtained by storing the truth table of the desired logic functions in the memory cells. An arithmetic functions configuration is obtained by internally interconnecting the memory cells. A read/-write memory function configuration is obtained by adding write address decoding, write enablement capability and input data leads. The configuration permits a parallel writing and reading of the memory cells, thereby effectuating a two-port memory operation. An added set of latches connected to the configurable function element and a configurable routing network connected to the inputs of the configurable function element, to the output of the configurable function element and to the output of the latches, form a powerful device that can be easily configured to any one of the three primary modes (logic, arithmetic and memory). A generalized routing fabric coupled to the routing network provides for configurable connections to other configurable function devices. To minimize the load that such a device may present to the routing fabric because of the various configurable interconnections that it can effect, the input leads from the routing fabric to the routing network in configurable function device are all multiplexed to one, or a few contact points, via an intermediate level of routing.

14 Claims, 7 Drawing Sheets

FULLY CONFIGURABLE VERSATILE FIELD PROGRAMMABLE FUNCTION ELEMENT

BACKGROUND OF THE INVENTION

This invention relates to configurable logic elements and arrays of configurable logic elements. More particularly, this invention relates to configurable logic elements that are capable of logic operations, arithmetic operations and data storage.

Since the introduction of electronic computing, the trend has been toward decreased use of hard-wired logic in favor of electronically programmable systems. Example milestones include stored program control computers, programmed memory management arrangements, programmable input/output controllers, intelligent terminals and modems. In recent years, the very definitions of hardware/firmware/software have become blurred with the development of EEPROM (Electrically Erasable Programmable Read Only Memory) and PAL (Programmable Array Logic) elements, which are hardware devices that can be modified under software control. Each of these steps has allowed more of the functionality of greater numbers of subsystems to be altered by software, but the connection among the subsystems has remained largely fixed. As the evolution continues, the interconnectivity of these subsystems is also made programmable, thus expanding the size of systems that can be programmed in great detail.

In U.S. Pat. No. 4,706,216 issued Nov. 10, 1987, a configurable logic element is described. That logic element is embedded in a configurable routing fabric that allows many different interconnections of the embedded configurable logic elements. In connection with the routing fabric, the term "configurable" means that a plurality of buses are provided, with switches arranged to connect one bus to another under control of a signal derived from a control bit stored in association with the routing fabric. From time to time, the information in the control bits may be changed (for example, when the designer choses to try a different interconnection pattern) and thereby the interconnection of the routing paths is changed and the functionality of the entire arrangement is altered. In connection with the logic elements, the term "configurable" means that control bits are included in the element and those control bits dictate which of a plurality of logic functions are carried out by the logic element. The general structure of each of the configurable logic elements in the '216 patent, together with a portion of the configurable routing network that is closely associated with the logic elements, is depicted in FIG. 1 (which is a combination of FIGS. 7 and 8 of the '216 patent).

In FIG. 1, selector 10 is the configurable routing network portion. It includes four direct inputs (A, B, C and D) and a feedback input. Under configuration control bits (not shown), selector 10 outputs one signal set on bus 11 and another signal set on bus 12. The two signal sets are applied to an arithmetic/logic unit 15 which develops two outputs on leads 13 and 14. Those two outputs as well as the A lead input are applied to a selector circuit 16. Selector 16 has two outputs which are applied to selector circuit 17. One of the outputs of selector circuit 16 is also applied to a latch circuit 18 whose output is applied to selector circuit 17. Selector 17 develops the feedback input and two outputs (X and Y) of the configurable logic element. Thus, from the viewpoint of overall functionality, the configurable logic element of the '216 patent develops two output signals in response to four input signals.

The arithmetic/logic element 15 comprises two 8-bit RAMs (FIG. 8 in the patent). Each is responsive in effect, to a 3-bit address. The contents of the memory (which are loaded at configuration time) dictates the logic function that the unit performs. No means are provided for modifying the contents of those memories during operation. Also, aside from the latch at the output of selector 16, no read/write memory is available in the unit. This is a substantial disadvantage of the unit because in many applications a need exists for buffering data that is generated by one or more of the configurable elements in the configurable arrangement, or array, that is made up of those units. Additionally, the device described in the '216 patent is not well suited for arithmetic functions such as addition or subtraction. First, such operations require 2N+1 inputs, where N is an integer, and the '216 device had only four inputs, which does not satisfy the 2N+1 requirement. Secondly, and more importantly, the interconnection structure within the device provides for no direct connectivity between the two 8-bit RAMs (the function defining elements), which substantially limits the functional flexibility of the device in connection with arithmetic operations.

SUMMARY OF THE INVENTION

The deficiencies of prior art configurable function elements are overcome with this invention by providing for multi-function use of memory cells, by organizing the cells in memory banks and by providing internal configurable interconnections of the memory banks. A versatile logic function configuration is obtained by storing the truth table of the desired logic functions in the memory cells. An arithmetic function configuration is obtained by internally interconnecting the memory cells, and a read/write memory function configuration is obtained by adding write address decoding, write enablement capability and input data leads. This configuration permits an independent writing of the memory cells, thereby effectuating a two port memory operation.

An added set of latches connected to the configurable function element, and a configurable routing network connected to the inputs of the configurable function element, to the output of the configurable function element and to the output of the latches, form a powerful device that can be easily configured to any one of the three primary modes (logic, arithmetic and memory).

To enhance the functionality of the device, in accordance with another feature of this invention, it is coupled to a generalized routing fabric which provides for configurable connections to other configurable function devices. To minimize the load that such a device may present to the routing fabric because of the various configurable interconnections that it can effect, the input leads from the routing fabric to the routing network in configurable function device are channeled through a single contact point which provides load isolation and thereby enhances the overall operational speed.

DETAILED DESCRIPTION

Figure 1:
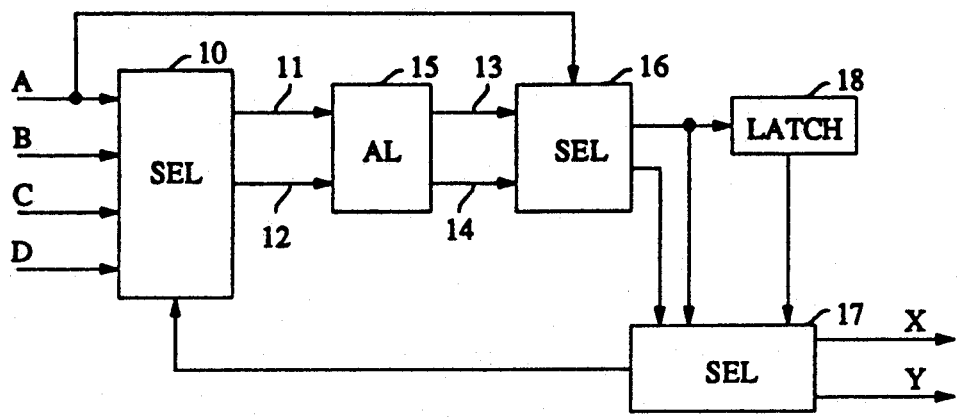
FIG. 1 presents the block diagram of a prior art configurable logic element.
Figure 2:
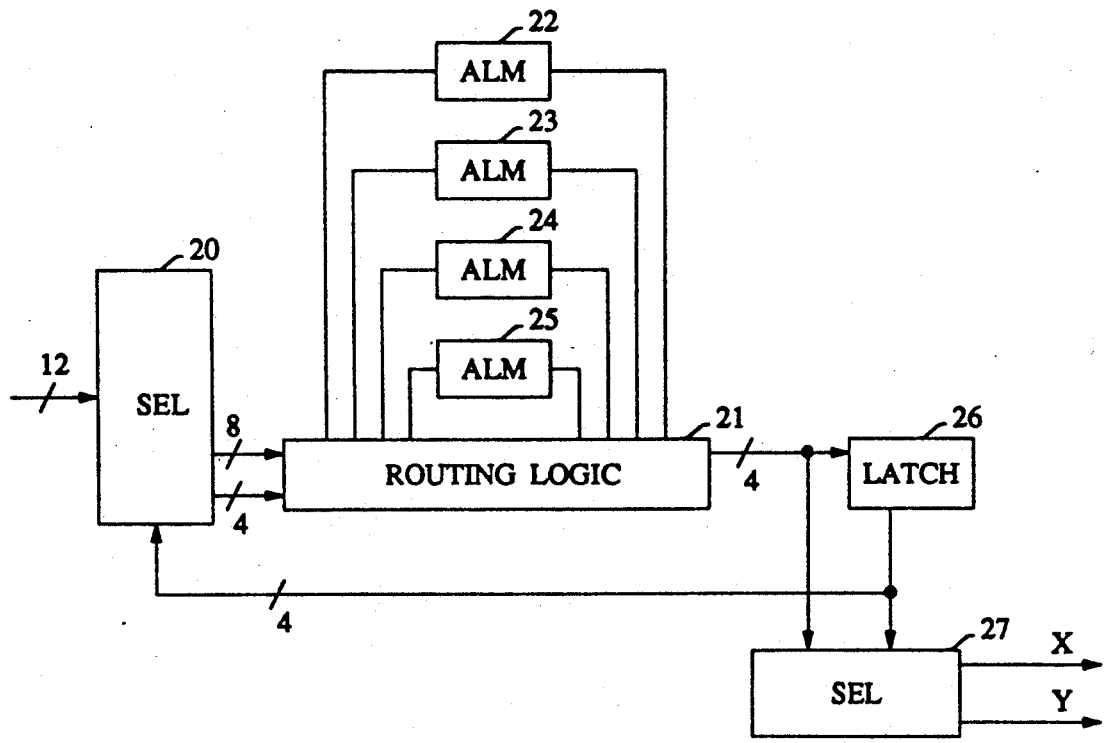
FIG. 2 presents a similar block diagram of the configurable function element of this invention.

FIG. 2 presents a coarse representation of a configurable device in accordance with the principles of this invention. For sake of comparison, to the extent possible, the structure of FIG. 2 parallels the structure of FIG. 1. As in FIG. 1, FIG. 2 includes a selector at the input, which in this case is also a part of the routing fabric. Selector 20 has 12 direct inputs and 4 feedback inputs. The outputs of selector 20 are applied to a routing logic network 21, and connected to routing logic network 21 are four essentially independent arithmetic/logic/memory (ALM) units 22, 23, 24, and 25. Routing logic network 21 allows for various interconnections of the ALM units develops output signals which are applied to a plurality of latches 26, and the outputs of latches 26 form the feedback signals that are applied to selector 20. A selector 27 is responsive to the signals applied to latches 26 and to the signals developed by latches 26 and selects the desired outputs in accordance with a configuration specification.

Figure 3:
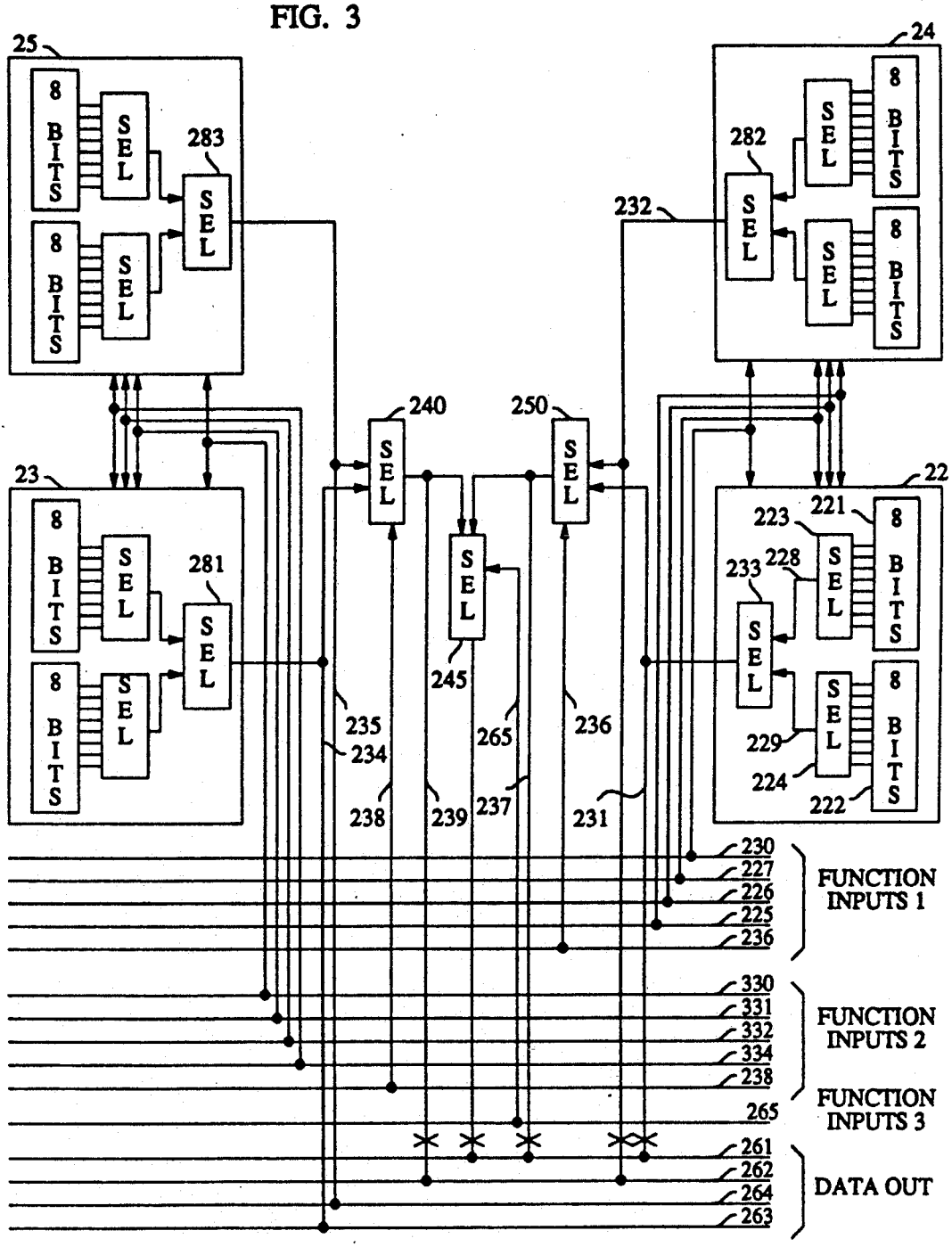
FIG. 3 depicts some of the configured connections between the ALM elements of FIG. 2 and routing network 21, and some of the configured connections within network 21, when the function element is configured for logic functionality.
Figure 4:
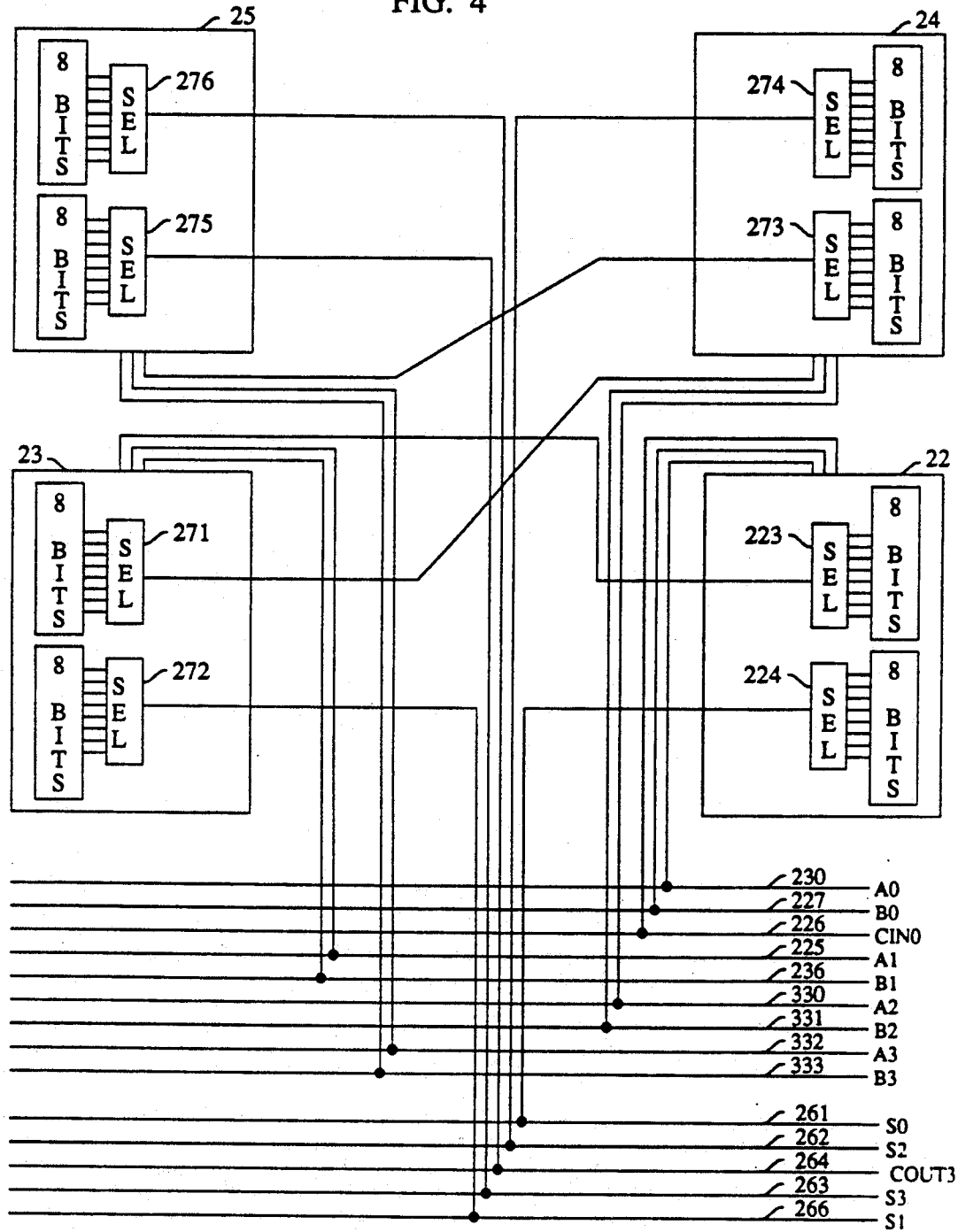
FIG. 4 depicts some of the configured connections between the ALM elements of FIG. 2 and routing network 21, and some of the configured connections within network 21, when the function element is configured for arithmetic functionality.
Figure 5:
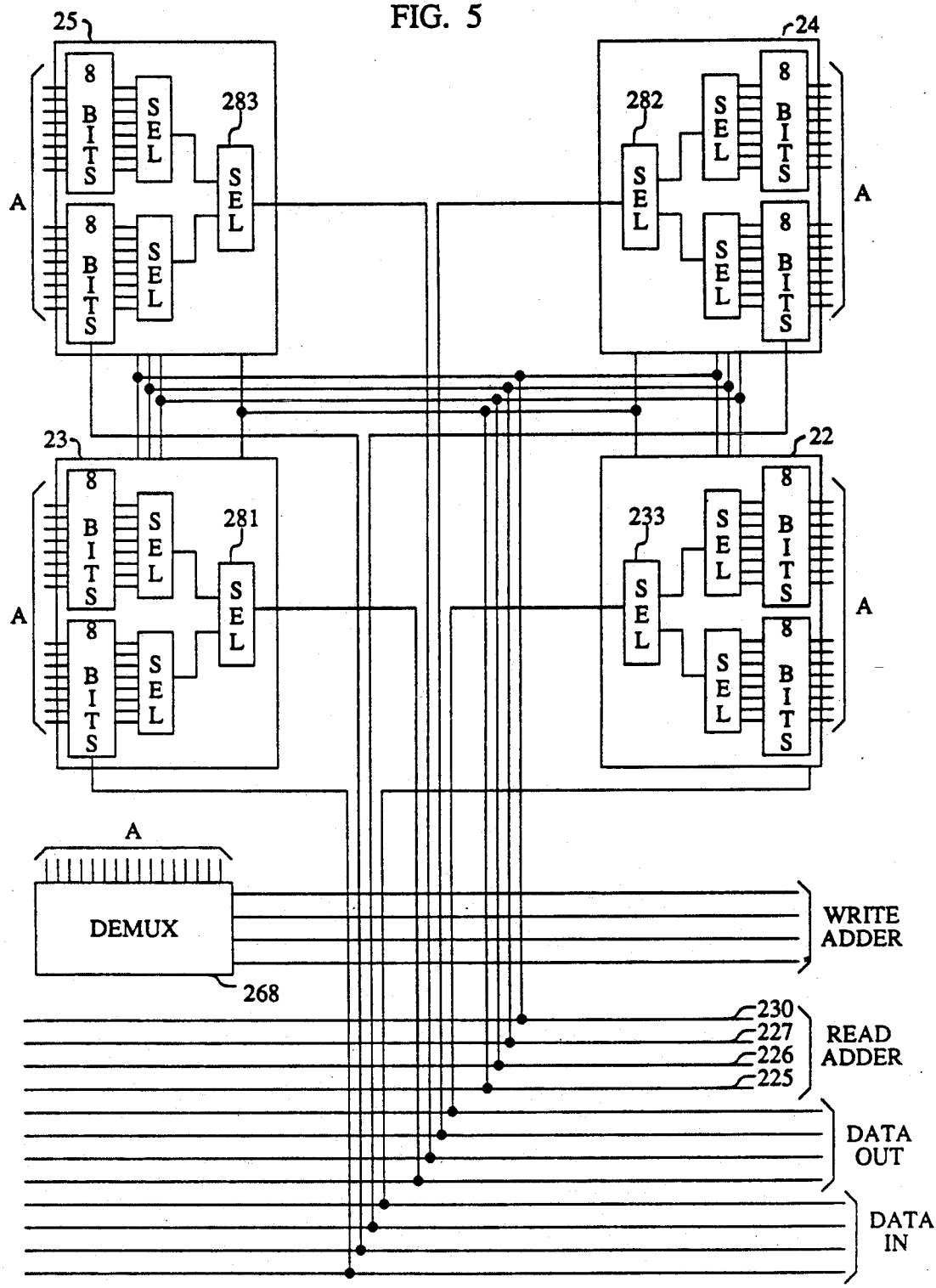
FIG. 5 depicts some of the configured connections between the ALM elements of FIG. 2 and routing network 21, and some of the configured connections within network 21, when the function element is configured for read/write memory functionality.

Elements 22-25 are termed herein "arithmetic/logic/memory" elements, or ALM elements, because they have the inherent capacity to serve in any of the three modes: arithmetic, logic, and memory. This inherent capacity is brought to light through configuration control of the elements. FIGS. 3, 4 and 5, which describe the configurable function element, comprising elements 21-25, describe those modes in greater detail.

FIG. 3 depicts the configuration for logic operation. ALM element 22 has 8 bit banks of memory cells 221 and 222. The other ALM elements also have two banks of memory cells each. The logic performed by the memory banks is simply a function of the contents of the memory. This contents basically reflects the "truth table" of the logic function, which is carried out by virtue of the accessing of the "truth table" memory. This accessing is accomplished through selector circuits 223 and 224. Circuit 223 is a 8-to-1 selector that is controlled by the three signals on lines 225, 226 and 227. The output of selector 223 appears on line 228. The same three signals also control selector 224 (although for sake of simplicity, this is not shown) to deliver a signal to line 229.

Memory bank 221 can hold the "truth table" for any three input-one output logic function because the three "address" inputs of selector 227 can deliver to line 228 the truth table response to the three inputs, stored in the $2^3$, or 8, bits of memory 221. By extension, it is clear that memory bank 222 can also hold the "truth table" for any three-input one output (line 229) logic function. Leads 228 and 229 are connected to selector circuit 233, which is responsive to control lead 230, and the output of selector 233 forms a first data output that is connected to bus line 261. With the aid of selector 233, the two memory banks of ALM element 22 can carry out any logic function of 4 bits in (lines 225, 226, 227 and 230)-1 bits out (line 231).

ALM elements 23, 24 and 25 are identical to ALM element 22. Element 24 is responsive to the same 4 inputs as is element 22 and it develops an output signal on line 232. That signal is applied to I/O bus line 262. Elements 23 and 25 are responsive to input signals on lines 330, 331, 332, and 334 and they develop an output on lines 234 and 235, respectively, which are connected to I/O bus lines 263 and 264. Thus, elements 22 and 24 combine to offer a logic element that provides two outputs in response to four inputs, and elements 23 and 25 combine to offer a logic element that also provides two outputs to four *different* inputs.

The operation of the configurable function element is expanded in the FIG. 3 embodiment through selectors 240, 245 and 250. Selector 250 accepts the signals of lines 231 and 232 and, under control of line 236, delivers an output signal to I/O bus line 261 via line 237. Similarly, selector 240 accepts the signals of lines 234 and 235 and, under control of line 238, delivers an output signal to I/O bus line 262 via line 239. Selector 250 converts elements 22 and 24 to a single logic element having five inputs and one output. Similarly, selector 240 converts elements 23 and 25 to a single logic element having five inputs and one output. Selector 245 accepts the signals of lines 237 and 238 and under control of line 265, delivers an output signal to I/O bus line 261. Selector 245 combines elements 22-25 to form a single logic element capable of performing any arbitrary function of up to 6 inputs and one output. Note that it can also do some functions of up to 11 variables.

FIG. 4 depicts the arithmetic mode of the configurable function element. Before proceeding with the detailed description, it may be useful to keep in mind that arithmetic operations are also logic operations although, typically, we divide the data that represents arithmetic quantities into small groups and each group represents a binary digit. Consequently, the "truth tables" that are needed for arithmetic operations are smaller. However, connections must be provided from one digit to the next. That is, arithmetic operations carry out a logic function which considers at any one time only one pair of input bits in addition to a "carry" bit from a previous pair of bits. For example, a logic element having 8 inputs can assume any response pattern and, therefore, a "truth table" having $2^8$ states is needed for such a logic element. An arithmetic element having 8 inputs, on the other hand, typically is considered to have four two bit sets, and the operation on the four two bit sets is typically carried out on only two input bits at a time (one from each set) and an incoming information propagation bit (from lower significance bits). The output is typically one computation result bit and one outgoing information propagation bit. Thus, when an arithmetic truth table is created from a look-up memory (for any bitwise arithmetic operation), each bit set requires only $2^3$, or 8 bits of memory, twice; and the full set of 8 bits at the input (plus the input information propagation bit) requires only 64 bits of memory. That is the structure depicted in FIG. 4.

In conformance with the above, FIG. 4 contains 4 sets of bitwise arithmetic units. The three input signals that control selectors 223 and 224 (lines 226, 227 and 230) form the two input bits $a_0$ and $b_0$ and the incoming information propagation bit $c_{IN}0$. The output of selector 224 forms the computation result bit (connected to I/O bus line 261) and the output of selector 223 forms the outgoing information propagation bit. The outgoing information propagation bit of selector 223 is connected directly to selectors 271 and 272 in ALM element 23 wherein it serves the function of incoming information propagation bit $c_1$ for the input bits $a_1$ and $b_1$ that are also connected to selectors 271 and 272 from lines 225 and 236. The arithmetic operation signal flow continues with the outgoing information propagation bit of selector 271 being applied to selectors 273 and 274 in ALM element 24, and the outgoing information propagation bit of selector 273 being applied to selectors 275 and 276. The computation result bit of selector 272 is connected to I/O bus 266 and the computation result bit of selector 274 is connected to I/O bus 262. Finally, the computation result bit of selector 276 is connected to I/O bus line 263 and the outgoing information propagation bit of selector 275 is delivered to output lead 269 for use by the next configurable element in the array, if needed.

From the above it is clear that the ALM elements weigh in with a total of 64 bits. In the logic mode (FIG. 3) and in the arithmetic mode (FIG. 4) the contents of each of the bits is fixed at the time the configuration is set. That may be at the time of initial assembly, or at any time thereafter. It is not the intent of these memory cells to store data temporarily but rather to define the behavior, or response characteristic, of the configurable function element.

It is one object of this invention, however, to permit just such a use. Moreover, it is deemed beneficial to permit flexibility in the manner in which the data is stored in and in the manner in which the data is retrieved. This flexibility extends to dual port operation of the "memory", which means writing into one address of the memory at the same time that the memory contents at other addresses are being read.

With the 64 bits that are available, the memory may be organized in a number of ways, and the writing organization and the reading organization need not even be the same. For illustrative purposes, FIG. 5 describes a 4 bit organization where the number of different addresses that one may access is 16. With 4 bits for an input address, 4 bits for input data, 4 bits for output address and 4 bits for output data, a total of 16 I/O bits is required.

In FIG. 5, the four write address bits are applied to a 1-to-16 demultiplexer 268, and each of the 16 outputs of the demultiplexer is connected to the write enable lead of a different one of the cells in the memory banks of each of the ALM elements (22-25). The input data line $D_{IN}0$ is connected to each of the memory cells in ALM element 22, the input data line of $D_{IN}1$ is connected to each of the memory cells in ALM element 23, the input data line $D_{IN}2$ is connected to each of the memory cells in ALM element 24, and the input data line $D_{IN}3$ is connected to each of the memory cells in ALM element 25.

Reading the memory in FIG. 5 is quite simple, given the circuitry that is already available from the "logic configuration" (shown in FIG. 3). The read address lines are applied to leads 225, 226, 227 and 230 and the output of selectors 235, 281, 282, and 283 form the 4 bits output of the memory.

In FIG. 3, the number of inputs is 11 and the number of outputs is 4; in FIG. 4, the number of inputs is 9 and the number of outputs is 5; and in FIG. 5, the number of inputs is 12 and the number of outputs is 4. Clearly, for FIGS. 3-5 to be realizable in a single integrated circuit, some I/O lines have to be used for different purposes when operating in different mode, and those lines must be routed to different locations internally. This is accomplished by extending each line to all of its potential destinations and by interposing switches in those lines at the right places, so that the lines apply their signals to the appropriate places. This is demonstrated in FIG. 6, where the FIGS. 3-5 circuits are combined (the reference numerals being deleted for sake of simplicity). Some of the configuration switches are shown with the mark X.

As mentioned above, it is contemplated that the configurable function element described in FIGS. 3, 4 and 5 in its various modes shall be used most often as an element embedded in a configurable routing fabric.

Figure 7:
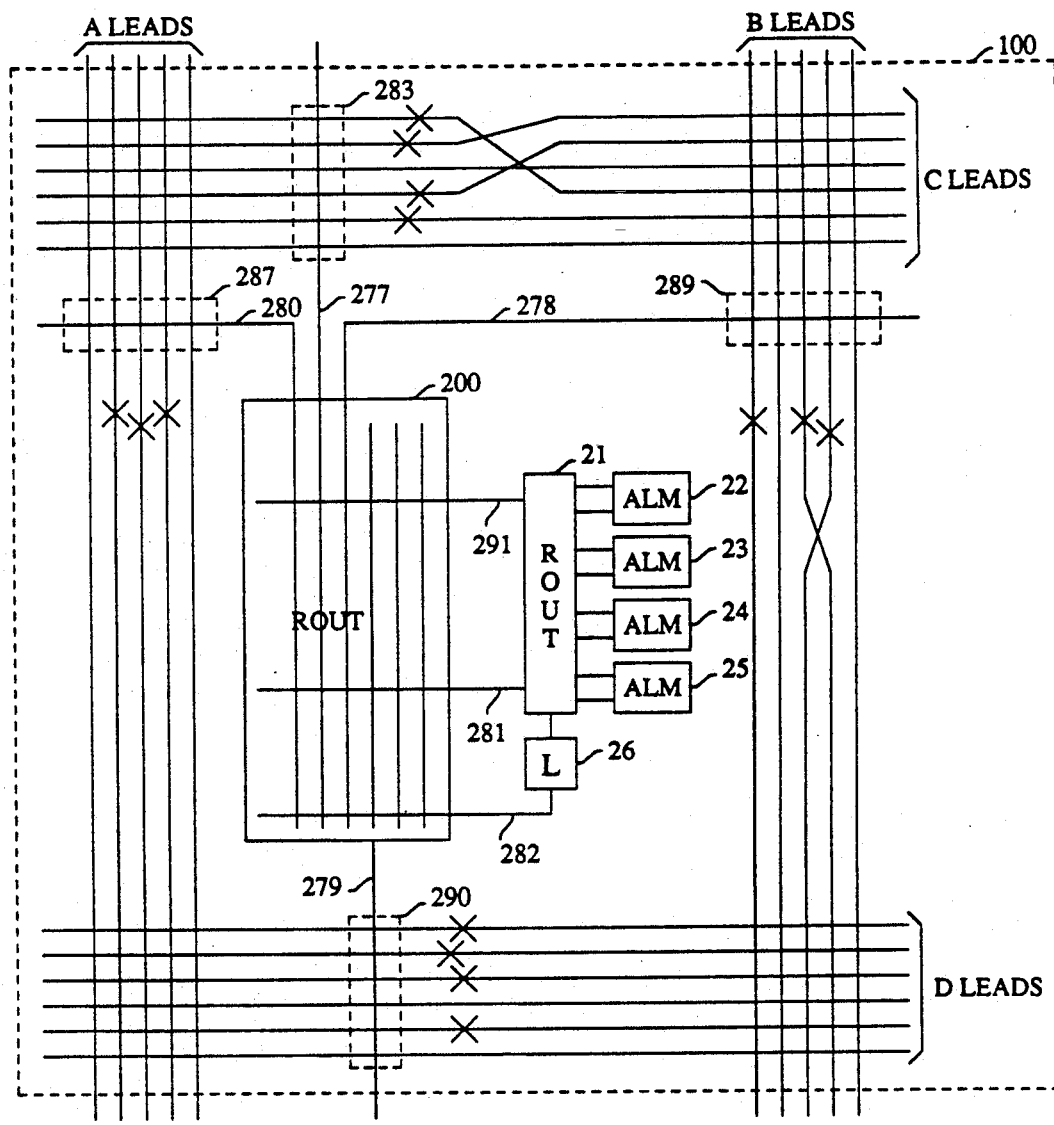
FIG. 7 illustrates the interconnection of the FIG. 2 configurable function device within a larger configurable routing fabric.

FIG. 7 presents a "tileable" module of the routing fabric which includes the configurable function element (elements 21-25), the switching of elements 20 and 27 (which are illustrated in FIG. 2 and embedded in routing network 200) and latches 26. More specifically, the "tileable" module 100 comprises vertical A leads, vertical B leads, horizontal C leads and horizontal D leads. The vertical leads and the horizontal leads (perimeter leads) are arranged to form a center area where switching elements 20 and 27 (i.e., element 200), latches 26 and the configurable function element (21-25) reside. The module is "tileable" because an identical other tileable module may be connected on each of the four sides of the module via some or all of the A, B, C, and D perimeter leads, and the connection of "tileable" modules can be extended for as many modules as desired, to form a rectilinear arrangement. It may be observed that when such tiling occurs, leads B of one tiled module are adjacent to leads A of the next tiled module next to it, and the A leads at the top of one module are connected to the A leads at the bottom of the adjacent module that is above it. It may also be observed that some of the A, B, C, and D leads include interposed switches that are controlled by configuration information. The pattern of switches need not be the same.

In FIG. 2 switching elements 20 and 27 are depicted as separate elements but, in reality, they can be constructed from a single switching network and, therefore, in FIG. 7 they are represented by routing network 200. Network 200 is depicted as a crossbar network. Input lines 277, 278, 279 and 280 come from the perimeter lines, line 281 comes from routing network 21 and line 282 comes from the outputs of latches 26. Actually, each of the depicted lines represents a set of lines, as described in greater detail below. From a perusal of FIGS. 3, 4 and 5 is can be seen that the necessary number of inputs to block 21 is 12 and, hence, the number of outputs of network 200 is likewise 12.

Figure 6:
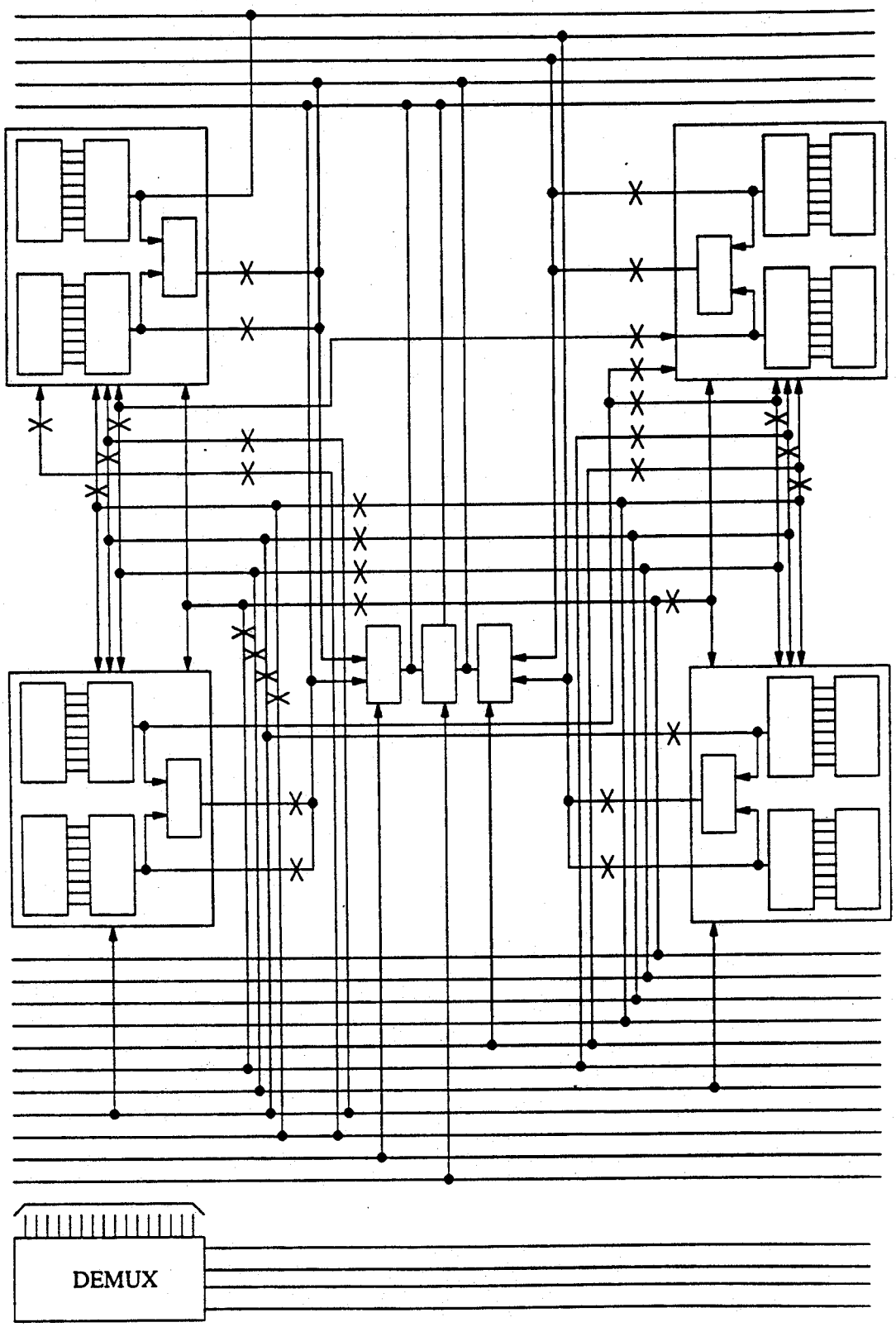
FIG. 6 combines FIGS. 3, 4 and 5 and shows some of the configuration control switches.

In considering the viability of the FIG. 6 arrangement where tileable modules are interconnected one important aspect is the speed with which the arrangement can operate. More particularly, the resistive and capacitive load that is found on each of the perimeter lines must be carefully considered. It must be remembered, for instance, that each lead to 1 from the perimeter to network 200 presents a load to the perimeter line even when that line is disabled. This load is minimized, in accordance with one feature of this invention, through an isolation mechanism that, in effect, fans out the signal of a perimeter lead through a number of crosspoints. This is depicted in FIG. 8.

Figure 8:
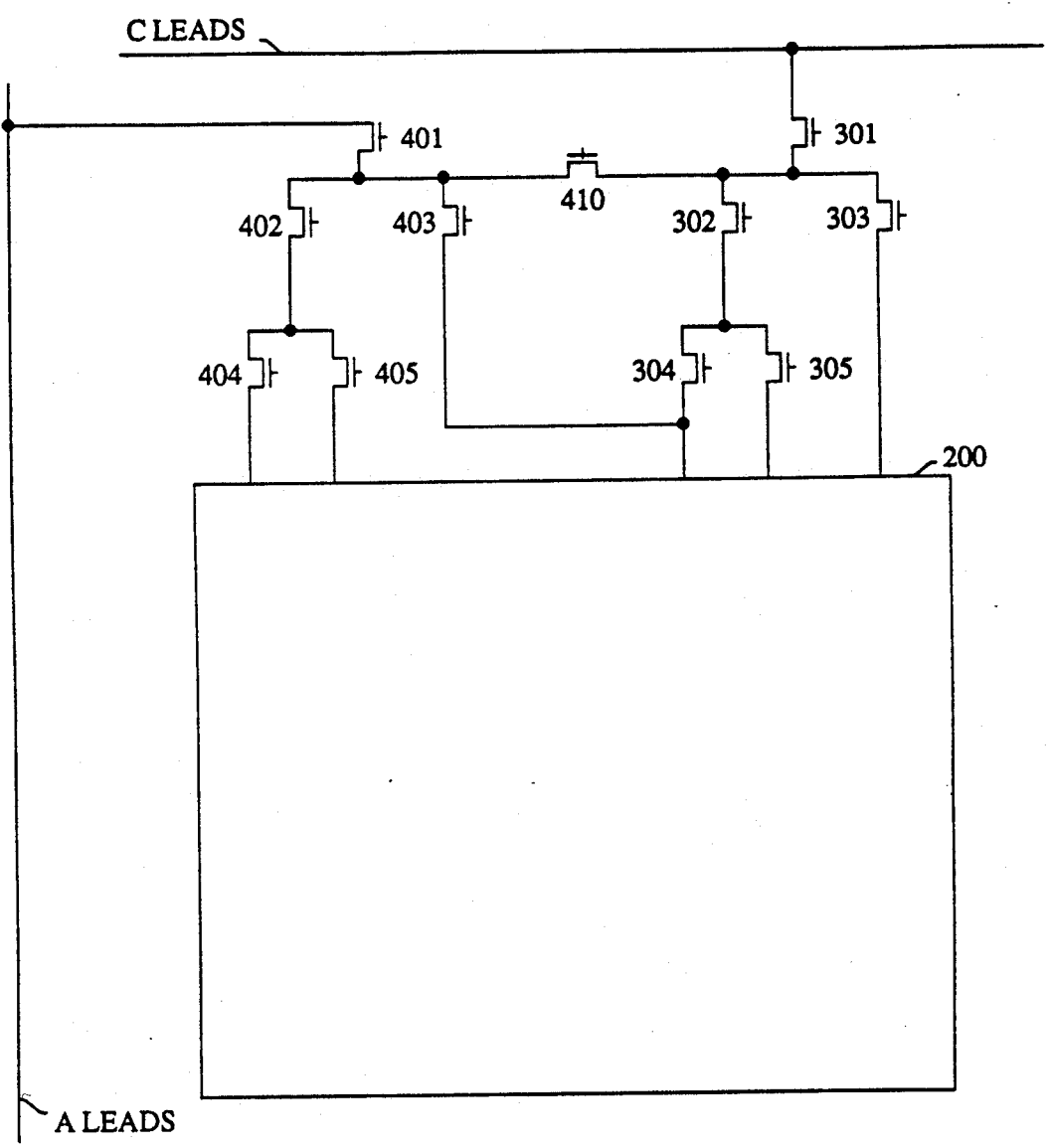
FIG. 8 provides some details of the structure within block 293.

FIG. 8 shows one arrangement in accordance with the principles of this invention. It depicts only one C lead (from network 288 in FIG. 7) and one A lead (from network 287 in FIG. 7), but it should be understood that similar circuitry is included in the tileable modules any number of C and A leads, for interconnecting leads B and D into network 200 and for interconnecting the A, B, C, and D leads to each other.

The primary isolation (and load limiting) is provided to lead C by virtue of FET switch 301. When it is "off", all of the circuits that follow FET 301 do not present a load the C lead. The output of FET 301 is connected to any number of secondary FETs, and in FIG. 8 two are shown: 302 and 303. Those, in turn can be connected to tertiary fan-out FETs, such as FETs 304 and 305, etc., depending on the routing flexibility that is desired. Eventually, the set of leads that are developed by the chain of FETs stemming from FET 301 is applied to network 200. Similarly, FET 401 is connected to lead A and it, too, fans out through FETs 402, 403, 404 and 405 to network 200. A connection between the A lead and the C lead is achieved through FET 410.

I claim:

1. A configurable function element including K memory cells, K being an integer, and configurable selection means coupled to said memory cells and responsive to applied data input signals, for accessing information stored in one or more said memory cells and delivering the accessed information to one or more output ports of said function element, the improvement comprising:
    said configurable selection means including means for forming M memory subsets of 16 memory cells each, M being an integer, where each of said memory subsets develops two output bits in response to at most three selections bits applied to said memory subsets; and
    said configurable selection means including means for forming a chain of said memory subsets by connecting one of said two output bits of memory subset i, where i is and integer index ranging from 1 to M−1, to one of said three section bits of memory subset i+1.

2. The function element of claim 1 wherein said configurable selection means further includes
    means for deriving, from said data input signals, the three selection bits of memory subset 1 and the two selection bits of memory subsets 2 through M that are not derived from said means for forming a chain;
    means for delivering the two output bits of said subset M to said output ports of said function element; and
    means for delivering, to said output ports of said function element, the one output bit of said subsets 1 through M-1 that is not connected by said means for forming a chain.

3. The function element of claim 1 further comprising:
    means for applying a different data bit to each of L memory groupings of said K memory cells, with the groupings having K/L memory cells each, L being an integer;
    decoding means, responsive to write address bits, for selecting a cell in each of said L memory groupings, with the selected cells in each of the L memory groupings forming a memory word; and
    means for storing of the data bit applied to each of said memory groupings into the selected cell, thereby storing a data word made up of said different data bits into a memory word identified by said decoding means.

4. The function element of claim 3 wherein said configurable selection means includes means for accessing the data words stored in any of said memory words accessible by said decoding means and applying the accessed data to said output ports of said function element.

5. The function element of claim 4 wherein said means for accessing and said means for storing operate concurrently.

6. The function element of claim 4 wherein said means for accessing and said means for storing operate to create a dual-port read/write memory from said K memory cells.

7. The function element of claim 1 further comprising device input ports,
    device output ports, and
    a routing network having a first set of I/O ports and a second set of I/O ports, for routing signals from said first set of I/O ports to said second set of I/O ports in accordance with configurable routing paths, with said device input ports being connected to said first set of I/O ports, said function element output ports being connected to said first set of I/O ports, a subset of said second set of I/O ports being connected to said function element input ports, and another subset of said second set of I/O ports being connected to said device output ports.

8. The function element of claim 7 further including a plurality of storage cells having inputs connected to output ports of said function element and outputs connected to said first set of I/O ports.

9. The function element of claim 7 further comprising a fan-out circuit interposed between each of said device input ports and one or more I/O ports of said first set of I/O ports.

10. The function element of claim 8 further comprising
    an upper horizontal perimeter bus connected through configurable contact networks to said device input ports,
    a lower horizontal perimeter bus connected through configurable contact networks to said device input ports,
    an left vertical perimeter bus connected through configurable contact networks to said device input ports, and
    a right vertical perimeter bus connected through configurable contact networks to said device input ports.

11. The function element of claim 10 wherein at least some of said perimeter buses have a plurality of lines each.

12. The function element of claim 11 wherein said configurable contact networks connected to said perimeter buses have a plurality of fan-out circuits, one for each single line of said perimeter buses and each to a single line of said perimeter buses and presenting thereto a load of a single cross-connect.

13. The function element of claim 11 further including configurable switches that coupled selected fan-out circuits that are connected to lines of a horizontal perimeter line to selected fan-out circuits that are connected to lines of a vertical perimeter line.

14. A configurable function element including K memory cells, K being an integer, and configurable selection means coupled to said memory cells and responsive to applied data input signals, for accessing information stored in one or more of said memory cells and delivering the accessed information to one or more output ports of said function element, the improvement comprising:

said configurable selection means including means for forming M memory subsets of C memory cells each, M being an integer greater than 1 and C being an integer equal to $r \times 2^{b+q}$, where b is the number of input bits applied to each memory subset, q is the number of propagating input bits applied to each memory subset and r is the total number of bits developed by each memory subset including propagating bits and output bits; and said configurable selection means including means for forming a chain of said memory subsets by connecting the propagating bits developed by memory subset i, where i is an integer index ranging from 1 to $M-1$, to memory subset $i+1$, forming therein said q propagating input bits.

* * * * *